(12) United States Patent
Lee et al.

(10) Patent No.: US 7,897,056 B2
(45) Date of Patent: Mar. 1, 2011

(54) APPARATUS FOR ETCHING OR STRIPPING SUBSTRATE OF LIQUID CRYSTAL DISPLAY DEVICE AND METHOD THEREOF

(75) Inventors: Won Jae Lee, Kyongsangbuk-do (KR); Dug Jang Lee, Kyongsangbukdo (KR)

(73) Assignee: LG Display Co., Ltd., Seoul (KR)

( * ) Notice: Subject to any disclaimer, the term of this patent is extended or adjusted under 35 U.S.C. 154(b) by 791 days.

(21) Appl. No.: 10/273,172

(22) Filed: Oct. 18, 2002

(65) Prior Publication Data
US 2003/0085195 A1  May 8, 2003

(30) Foreign Application Priority Data
Nov. 6, 2001 (KR) .............................. 10-2001-68903

(51) Int. Cl.
*B44C 1/22* (2006.01)
(52) U.S. Cl. .................. 216/23; 216/24; 216/41; 216/49; 216/83; 216/84; 134/18; 134/26; 134/32; 134/95.2; 134/95.3
(58) Field of Classification Search .................. None
See application file for complete search history.

(56) References Cited

U.S. PATENT DOCUMENTS

| | | | | |
|---|---|---|---|---|
| 3,772,105 | A * | 11/1973 | Shipley ............................ | 216/93 |
| 4,359,360 | A * | 11/1982 | Harris et al. ............. | 156/345.18 |
| 4,741,798 | A * | 5/1988 | Haas ................ | 216/86 |
| 4,904,339 | A * | 2/1990 | Diehl et al. ...................... | 216/92 |
| 5,308,447 | A * | 5/1994 | Lewis et al. ...................... | 216/23 |
| 5,387,313 | A * | 2/1995 | Thoms ............................ | 216/84 |
| 6,203,659 | B1 * | 3/2001 | Shen et al. ............... | 156/345.15 |
| 6,277,204 | B1 * | 8/2001 | Chang et al. ........................ | 134/2 |
| 6,368,415 | B1 * | 4/2002 | Asaoka .............................. | 134/3 |
| 6,446,645 | B1 * | 9/2002 | Doi ................................. | 134/61 |
| 6,495,055 | B2 * | 12/2002 | Lim et al. ......................... | 216/93 |
| 6,497,240 | B1 * | 12/2002 | Kobayashi et al. .......... | 134/64 R |
| 6,564,421 | B2 * | 5/2003 | Park et al. ........................ | 15/302 |
| 6,578,588 | B2 * | 6/2003 | Park, II .............. | 134/61 |
| 2002/0050322 | A1 * | 5/2002 | Kunisawa et al. ........ | 156/345.11 |
| 2003/0159718 | A1 * | 8/2003 | Kamikawa et al. .............. | 134/30 |

OTHER PUBLICATIONS

Tseng, Bob H.P. et al "A Novel Design for the Construction and Startup of an Eight Inch Pilot Line" IEEE/SEMI Advanced Semiconductor Manufacturing Conference, 1992, pp. 60-65.*

* cited by examiner

*Primary Examiner* — Anita K Alanko
(74) *Attorney, Agent, or Firm* — Birch, Stewart, Kolasch & Birch, LLP

(57) ABSTRACT

Disclosed are an apparatus for etching or stripping a substrate of a liquid crystal display device and a method thereof. The present invention includes carrying out an etching or stripping process on substrates using an etchant in a first etchant tank, counting a number of the substrates etched or stripped using the etchant in the first etchant tank, checking readiness of a second etchant tank at a predetermined point in time before the counted number reaches a maximum substrate number set up previously for the etchant tanks, and carrying out the etching or stripping process on the substrates using an etchant in the second etchant tank when the second etchant tank is in readiness for use and the counted number reaches the maximum substrate number.

13 Claims, 4 Drawing Sheets ized Korean Application No. P2001-68903 filed on Nov. 6, 2001, which is hereby incorporated by reference.

BACKGROUND OF THE INVENTION

1. Field of the Invention

The present invention relates to an apparatus for etching or stripping a substrate of a liquid crystal display device and method thereof.

2. Discussion of the Related Art

Generally, a liquid crystal display device has characteristics of low-voltage driving, full-color realization, light weight, compact size, and the like. Applicable fields of the liquid crystal display device extend to PDA, wide-screen TV, airplane monitors, calculators, watches, notebook computers, and the like. Such characteristics of the liquid crystal display device are fundamentally attributable to the use of thin film transistors.

A process of fabricating a thin film transistor in a liquid crystal display device includes the repeated steps of deposition, photoresist coating, mask installment, exposure, etching, stripping, and the like for forming a predetermined pattern.

The etching and stripping processes can be performed by dry or wet methods. Yet, in order to increase yield, shorten process time, save costs, and attain a well-patterned thin film transistor, the wet method is widely used. In this case, the wet method for the etching or stripping process is carried out in a manner wherein a substrate is placed into a reaction vessel filled with a liquid compound (etchant or stripper).

Hence, exchange of the compound solution (etchant or stripper) is required for the wet method.

A process of etching or stripping a substrate for a liquid crystal display device according to a related art process is explained by referring to the attached drawings as follows.

FIG. 1 illustrates a diagram of a related art apparatus for etching or stripping a substrate of a liquid crystal display device.

Referring to FIG. 1, substrates are loaded on a loader 100. In this case, it is assumed that deposition of required materials, photoresist coating, mask installment, and exposure of the photoresist have been carried out on the substrates. Meanwhile, the substrates are stacked separately in the loader 100. Then the substrates are conveyed through rollers.

In the substrate-proceeding direction shown in FIG. 1, the substrates are conveyed to a first neutral part 101a from the loader 100. The first neutral part 101a is a unit for progressing the substrates forward, and no processing is carried out in the first neutral part 101a. The first neutral part 101a includes an upper unit, a lower unit, and a convey roller (not shown).

The substrates having passed the first neutral part 101a are transferred to an etching reaction vessel 102 filled with an etchant for an etching process. In this case, a strong acidic solution is used as the etchant. The etching reaction vessel 102 includes at least three equivalent etching zones (not shown). The substrates pass the three etching zones for about 100 seconds so as to be etched. And, the three etching zones are connected to a single etchant tank, and a plurality of sprays (not shown) are installed at each of the etching zones. The sprays spray the etchant on the substrates simultaneously. Material on the substrate is removed in accordance with a desired pattern and the used etchant is returned to the etchant tank through a roller bath.

After completion of the etching process, the substrates enter a first cleaning unit 103 from the etching reaction vessel 102.

The substrates having passed the first cleaning unit 103 are transferred to the stripping apparatus in FIG. 1 for stripping processes that will be carried out successively. First of all, the substrates pass a second neutral part 101b. The second neutral part 101b is a unit for progressing the substrates forward, and no processing is performed in the second neutral unit 101b. The second neutral unit 101b includes an upper unit, a lower unit, and a convey roller (not shown).

The substrates having passed the second neutral part 101b enter a stripping reaction vessel 105 filled with a stripping solution. In this case, a strong alkaline solution is used as the stripping solution. The substrates are stripped in the stripping reaction vessel 105 for a predetermined time, and then discharged from the stripping reaction vessel 105.

After completion of the stripping process, the substrates are transferred to a second cleaning unit 106. A second cleaning process is carried out on the substrates in the second cleaning unit 106. After completion of the second cleaning process, the substrates are dried in a dry unit 107, and then transferred to an unloader 109.

In this case, the etchant tank of the etching reaction vessel 102 and the stripping tank of the stripping reaction vessel 105 are used for etching a number of the substrates, and then should be replaced by new etchant tanks. Hence, spare etchant tanks are required.

A method of replacing the tank in the apparatus according to the related art is explained by referring to FIG. 2 as follows.

FIG. 2 illustrates a flowchart of a process of exchanging an etchant tank of the apparatus in FIG. 1.

Referring to FIG. 2, it is assumed that the etching process is being carried out in the etching reaction vessel 102. In this case, it is also assumed that a first etchant tank 102a is used as the first etchant tank. Subsequently, it is checked whether the substrates etched by the etchant of the first etchant tank 102a attain a maximum substrate number available for the first etchant tank (S2). In this case, the previously set maximum substrate number is nine hundred.

If the number of the substrates etched by the etchant of the first etchant tank 102a is lower than nine hundred as the maximum substrate number, the substrates are continuously produced using the etchant of the first etchant tank 102a (S1). If the number is greater than or equal to nine hundred, a readiness state of a second etchant tank 102 is checked (S3).

If the second etchant tank 102a is not in a state of readiness, an alarm informing of a condition of abnormality of the apparatus is generated and the loader stops loading the substrates. Moreover, the substrate conveying unit and a substrate circulating unit in the apparatus are stopped. Meanwhile, if the second etchant tank 102b is in readiness, the first etchant tank 102a is replaced by the second etchant tank 102b. Hence, the etchant in the second etchant tank is supplied to the etching reaction vessel 102 and the contents of the first etchant tank 102a is entirely discharged outside (S4).

Subsequently, it is sensed whether the etchant in the first etchant tank 102a is discharged completely by a position sensor (S5). After a predetermined delay time goes by, the first etchant tank 102a is supplied with a new etchant (S6) and the first etchant tank 102a is heated (S8).

It is then checked by the position sensor whether the first etchant tank 102a is supplied with a required amount of the etchant (S9). Then it is checked by a temperature sensor whether the etchant in the first etchant tank 102a is in the required temperature range (S10).

Thereafter, it is checked whether the first etchant tank 102a is in readiness or not (S11, S12).

Unfortunately, the apparatus and method according to the related art have the following problems or disadvantages.

First of all, the apparatus is constituted in a manner such that the tanks are exchanged with each other by every setup value. Yet, there is no function of checking previously whether the tanks for the exchange are in readiness or not. If the tanks failing to be in readiness are exchanged, the substrates in progress in the apparatus are stuck in the apparatus so as to generate problems such as over-etching. Hence, failures of the liquid crystal display device occur.

Secondly, when failures occur, increased handling costs associated with the failed substrates cause unnecessary waste.

Thirdly, the etchant tanks are exchanged after removal of the failed substrates, thereby prolonging downtime of the apparatus.

SUMMARY OF THE INVENTION

Accordingly, the present invention is directed to an apparatus for etching or stripping a substrate of a liquid crystal display device and a method thereof that substantially obviates one or more problems due to limitations and disadvantages of the related art.

An object of the present invention is to provide an apparatus for etching or stripping effectively a substrate of a liquid crystal display device and a method thereof.

Another object of the present invention is to provide an apparatus for etching or stripping a substrate of a liquid crystal display device and method thereof enabling efficient exchange of an etchant tank.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of etching or stripping liquid crystal display substrates using an apparatus having first and second etchant tanks according to the present invention includes carrying out an etching or stripping process on the substrates using an etchant in the first etchant tank, counting a number of the substrates etched or stripped using the etchant in the first etchant tank, checking a readiness state of the second etchant tank at a predetermined point in time before the counted number reaches a maximum substrate number set up previously for the etchant tanks, and carrying out the etching or stripping process on the substrates using an etchant in the second etchant tank when the second etchant tank is in readiness for use and the counted number reaches the maximum substrate number.

Preferably, the method further includes putting the first etchant tank in a state of readiness after the first liquid tank is replaced by the second etchant tank, wherein putting the first etchant tank in a state of readiness comprises discharging the etchant in the first etchant tank completely, having a predetermined delay time, supplying the first etchant tank with a new etchant amounting to the quantity required, and heating the first etchant tank so that a temperature of the new etchant filling the first etchant tank stays within a setup temperature range.

Preferably, the method further includes carrying out the etching or stripping process continuously using the etchant of the first etchant tank when the counted number of substrates is smaller than the maximum substrate number set up for the etchant of the first etchant tank.

Preferably, the readiness of the second etchant tank means a state enabling draining of a required quantity of the etchant to an etching or stripping reaction vessel within a certain amount of time as well as maintaining a temperature of the etchant filling the second etchant tank at a temperature within a setup temperature range.

Preferably, the method further includes stopping placement of the substrates in the etching or stripping apparatus if the second etchant tank fails to be in a state of readiness.

In another aspect of the present invention, a method of etching or stripping liquid crystal display substrates using an apparatus having first and second etchant tanks includes carrying out an etching or stripping process on the liquid crystal display substrates having been placed in the apparatus using an etchant in the first etchant tank, counting a number of the substrates etched or stripped using the etchant in the first etchant tank, checking readiness of the second etchant tank when the counted number reaches a value attained by subtracting a number of the substrates placed in the apparatus previously from a maximum substrate number set up previously for the etchant tanks, and etching or stripping the substrates using an etchant in the second etchant tank when the second etchant tank is in readiness for use and the counted number reaches the maximum substrate number.

Preferably, the method further includes stopping the placement of a following one of the substrates in the apparatus when the second etchant tank fails to be in readiness, carrying out normal etching and stripping processes in order on the substrates placed in the apparatus previously using the etchant of the first etchant tank and draining the used etchant, and generating an alarm for alerting the apparatus.

Preferably, the first etchant tank is switched to the second etchant tank in a manner such that the etchant of the first etchant tank is drained and the etchant of the second etchant tank is supplied to the apparatus.

Preferably, the method further includes continuing the etching or stripping of the substrates using the etchant of the first etchant tank if the substrates of the maximum substrate number fail to be etched or stripped using the etchant of the first etchant tank.

Preferably, the maximum substrate number is 900 and a number of the substrates enabling to be placed in the apparatus is 19.

Preferably, the method further includes placing the first etchant tank in a state of readiness for later use after the first etchant tank is replaced by the second etchant tank.

More preferably, the step of putting the first etchant tank in a state of readiness includes discharging the etchant in the first etchant tank completely, having a predetermined delay time, supplying the first etchant tank with a new etchant and simultaneously heating the first etchant tank so that a temperature of the new etchant in the first etchant tank stays within a predetermined temperature range, and checking whether the first etchant tank is in readiness or not.

More preferably, discharging the etchant of the first etchant tank comprises checking whether the etchant of the first etchant tank is drained or not using a sensor.

More preferably, supplying the first etchant tank with an amount of the new etchant to meet the demanded quantity comprises checking the level to which the first etchant tank is filled with the new etchant using a sensor.

More preferably, the predetermined temperature range is 70±2° C.

In a further aspect of the present invention, an apparatus for etching or stripping liquid crystal display substrates includes a loader loading the liquid crystal display substrates in the apparatus wherein a layer is formed on each of the liquid crystal display substrates so as to be patterned externally, first and second etchant tanks providing liquids for etching or stripping the loaded substrates, and a controller counting a number of the substrates etched or stripped using the etchant in the first etchant tank, the controller checking readiness of the second etchant tank at a predetermined point in time before the counted number reaches a maximum substrate number allowed for the etchant tanks, the controller replacing the first etchant tank by the second etchant tank when the second etchant tank is in readiness for use and the counted number reaches the maximum substrate number.

Preferably, the readiness of the second etchant tank is checked when the counted number reaches a value attained by subtracting a number of substrates put in the apparatus previously from the maximum substrate number allowed previously to the etchant tanks.

Preferably, the counted number of the substrates corresponding to a time point for checking the readiness of the second etchant tank is 881 if the maximum substrate number is 900 and a number of the substrates that can be put in the apparatus is 19.

Readiness refers to the state in which the tank can drain a demanded quantity of the etchant for an etching or stripping process within a required amount of time as well as maintain a temperature of the etchant filling the second etchant tank at a temperature within a setup temperature range.

More preferably, the setup temperature range is 70±2° C.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
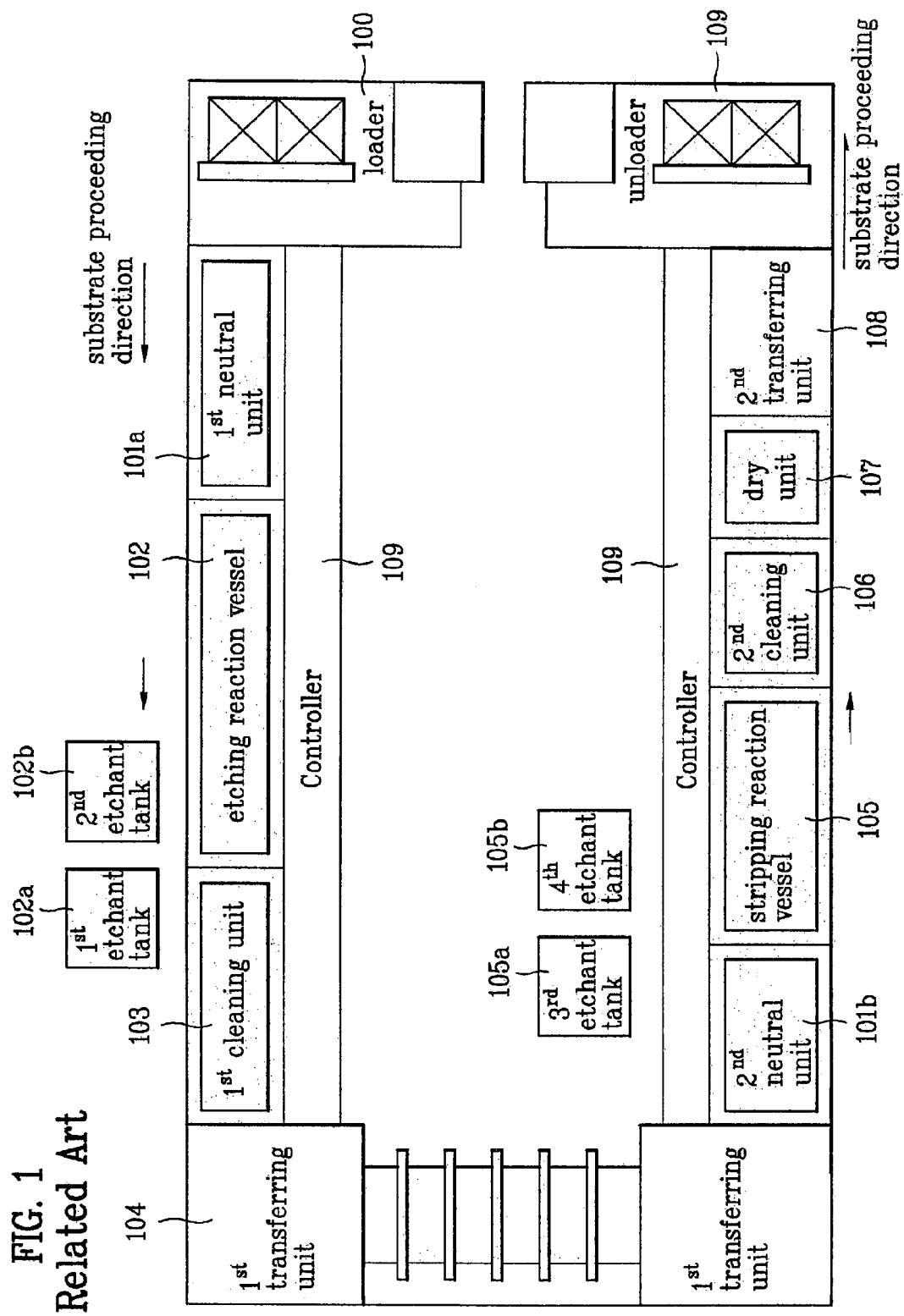
FIG. 1 shows a diagram of an apparatus for etching or stripping a substrate of a liquid crystal display device according to related art.
Figure 2:
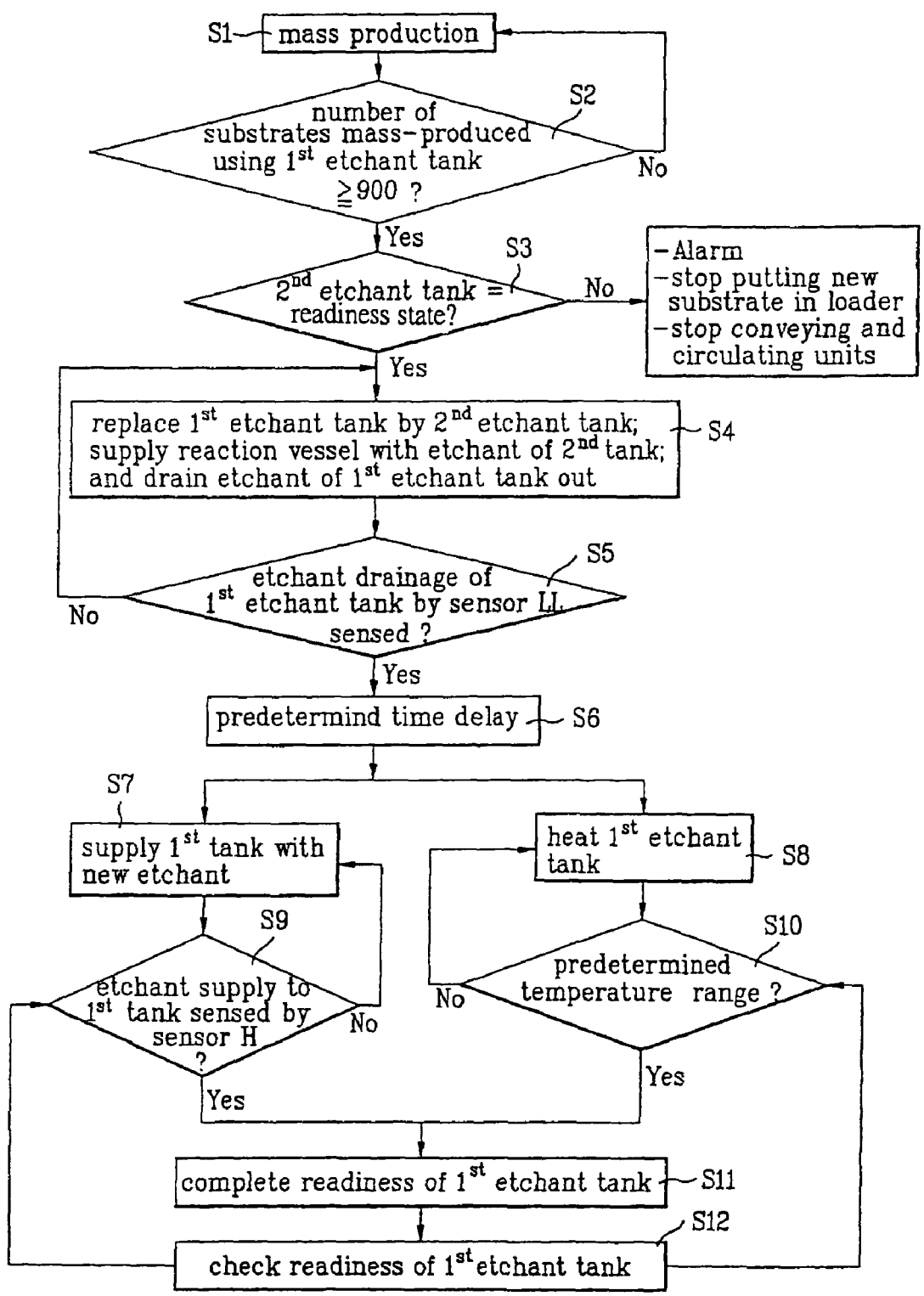
FIG. 2 shows a flowchart of a process of exchanging an etchant tank of the apparatus in FIG. 1.
Figure 3:
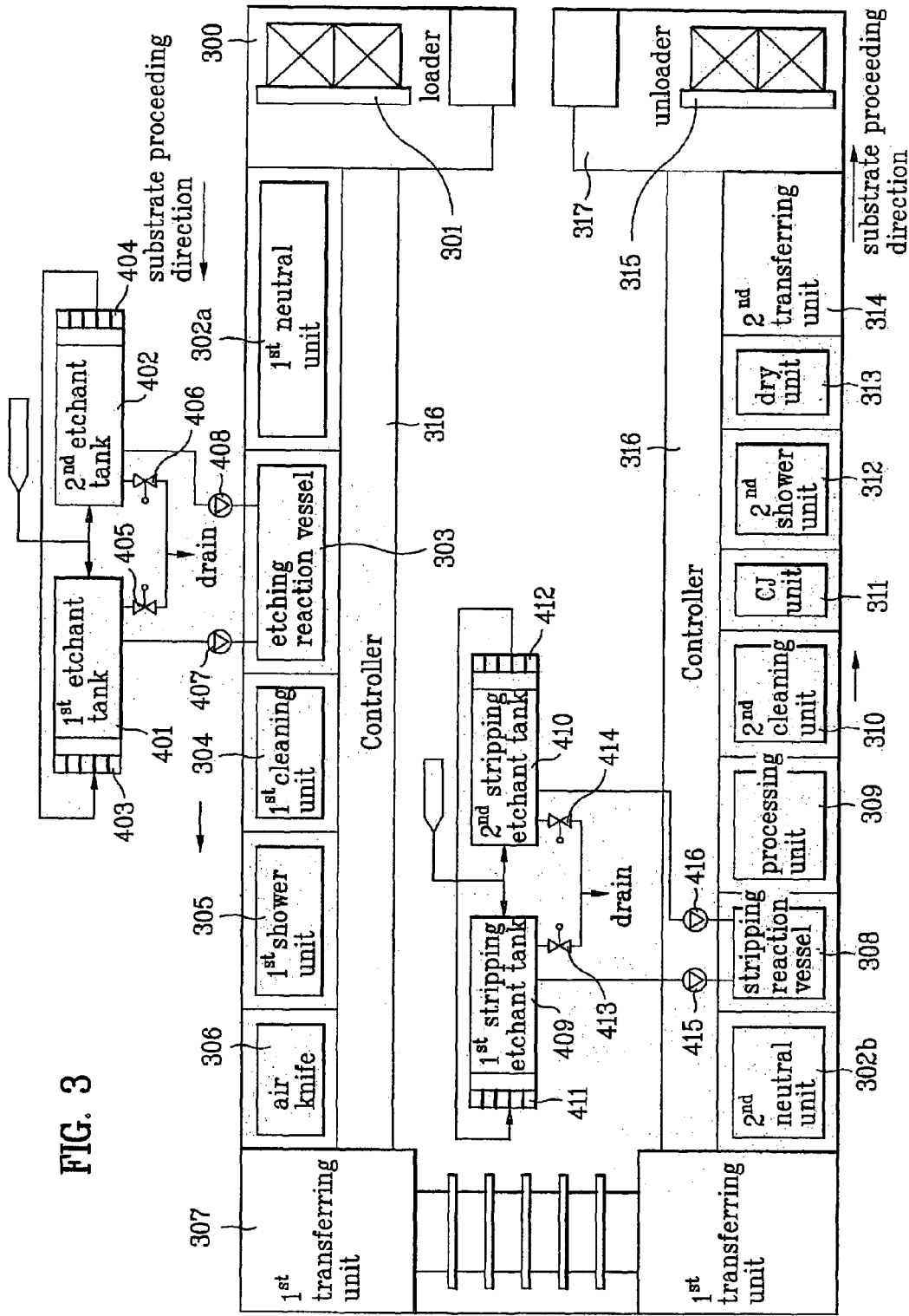
FIG. 3 shows a diagram of an apparatus for etching or stripping a substrate of a liquid crystal display device according to the present invention.

An apparatus according to the present invention is explained in detail by referring to FIG. 3.

First of all, a plurality of substrates are loaded on a loader 300 by a predetermined number unit. A cassette is placed in the loader 300, and the number of substrates amounting to the predetermined number can be placed in the cassette. Meanwhile, the substrates are placed in the apparatus of the present invention one by one for etching or stripping. Before the substrates are loaded on the loader 300, a layer of material to be patterned is deposited on each of the substrates and a photoresist is formed on the deposited layer for the patterning.

In the embodiment of the present invention, the deposited layer is a Cr layer from which a black matrix layer is formed on pixel electrodes. Hence, the photoresist is formed on the Cr layer.

Next, a mask having the required pattern is mounted on the photoresist layer. Subsequently, exposure, development, and mask removal are carried out in order so as to complete the required pattern on the photoresist.

The substrates, having undergone the above processes are put on the loader 300 so as to be stacked separately. Static electricity existing on the substrates in the loader 300 is removed by a first ionizer 301 connected vertically to the loader 300. The first ionizer 301 removes the static electricity by a method of reducing electric charges on a surface of each of the substrates by discharging ions.

The substrates amounting to the predetermined number are transferred to a first neutral unit 302a from the loader 300 one by one in a substrate-proceeding direction through rollers of the loader 300. The first neutral unit 302a progresses the substrates forward, and no processing is performed in the first neutral unit 302a. The first neutral unit 302a includes an upper unit, a lower unit, and a conveying roller.

The substrate having passed the first neutral unit 302a, enters an etching reaction vessel 303 filled with an etchant for the etching process. In this case, a strong acid is used as the etchant.

The etching reaction vessel 303 includes at least three equivalent etching zones (not shown in the drawing). The substrate passes the three etching zones for about one hundred seconds so as to be etched in accordance with the pattern of the photoresist. The three etching zones are connected to a single etchant tank. A plurality of sprayers are installed at each of the etching zones. And, each of the sprayers sprays the etchant from the etchant tank toward the substrate. Meanwhile, the etched-away portions of the substrate and the used etchant are fed back to the etchant tank.

After completion of the etching process, the substrate having passed the etching reaction vessel 303 enters a first cleaning unit 304 so as to undergo a cleaning process. In this case, deinonized water is used as a cleaning agent.

The substrate having undergone the cleaning process is transferred to an air-knife 306 through a first shower unit 305. The etchant remaining on a surface of the substrate is removed by air jetting from the air-knife 306.

The substrate having passed the air-knife 306 enters a stripping reaction vessel 308 filled with a stripping etchant through a first transferring unit 307 and a second neutral unit 302b for a further process of stripping the photoresist. Meanwhile, as mentioned in the foregoing description, the second neutral unit 302b progresses the substrate forward, and no process for etching or stripping is performed in the second neutral unit 302b. The second neutral unit 302b, like the first neutral unit 302a includes an upper unit, a lower unit, and a conveying roller.

A strong alkaline is used as the stripping etchant. The photoresist remaining on a surface of the substrate, and more specifically, on the Cr layer is stripped by the stripping etchant in the stripping reaction vessel 308 for a predetermined time. Meanwhile, the stripping reaction vessel 308 includes at least four equivalent reaction zones. Namely, the depicted photoresist formed on the surface of the substrate passes the four stripping zones for about one hundred seconds in order so as to be stripped from the substrates.

The four stripping zones are connected to a single stripping etchant tank, and a plurality of sprayers are installed at each of the stripping zones. The sprayers spray the stripping etchant toward the substrate simultaneously. The used stripping etchant is fed back to the stripping etchant tank through a roller bath.

The substrate having passed the stripping reaction vessel 308 is transferred to a processing unit 309 filled with an organic solvent, and then cleaned by the organic solvent in the processing unit 309. In this case, the organic solvent has the cleaning power. DMSO can be used as the organic solvent.

The substrate having passed the processing unit 309 is cleaned in a second cleaning unit 310. In this case, deionized water is used as a cleaning agent.

The substrate having passed the second cleaning unit 310 is transferred to a cavitation jet unit 311. The cavitation jet unit 311 jets deionized water combined with a strong air stream on the surface of the substrate so as to clean the substrate.

Subsequently, the surface of the substrate is completely cleaned by a shower of pure water (i.e. deionized water) in a second shower unit 312.

The substrate having passed the second shower unit 312 is dried in a dry unit 313, and then transferred to an unloader 317 by a second transferring unit 314. Meanwhile, static electricity remaining on surfaces of the substrates is removed by ions irradiated from a second ionizer 315 installed in a direction vertical to the unloader 317. The unloader 317 discharges the substrate, which has undergone the etching and stripping processes, to the outside.

Figure 4:
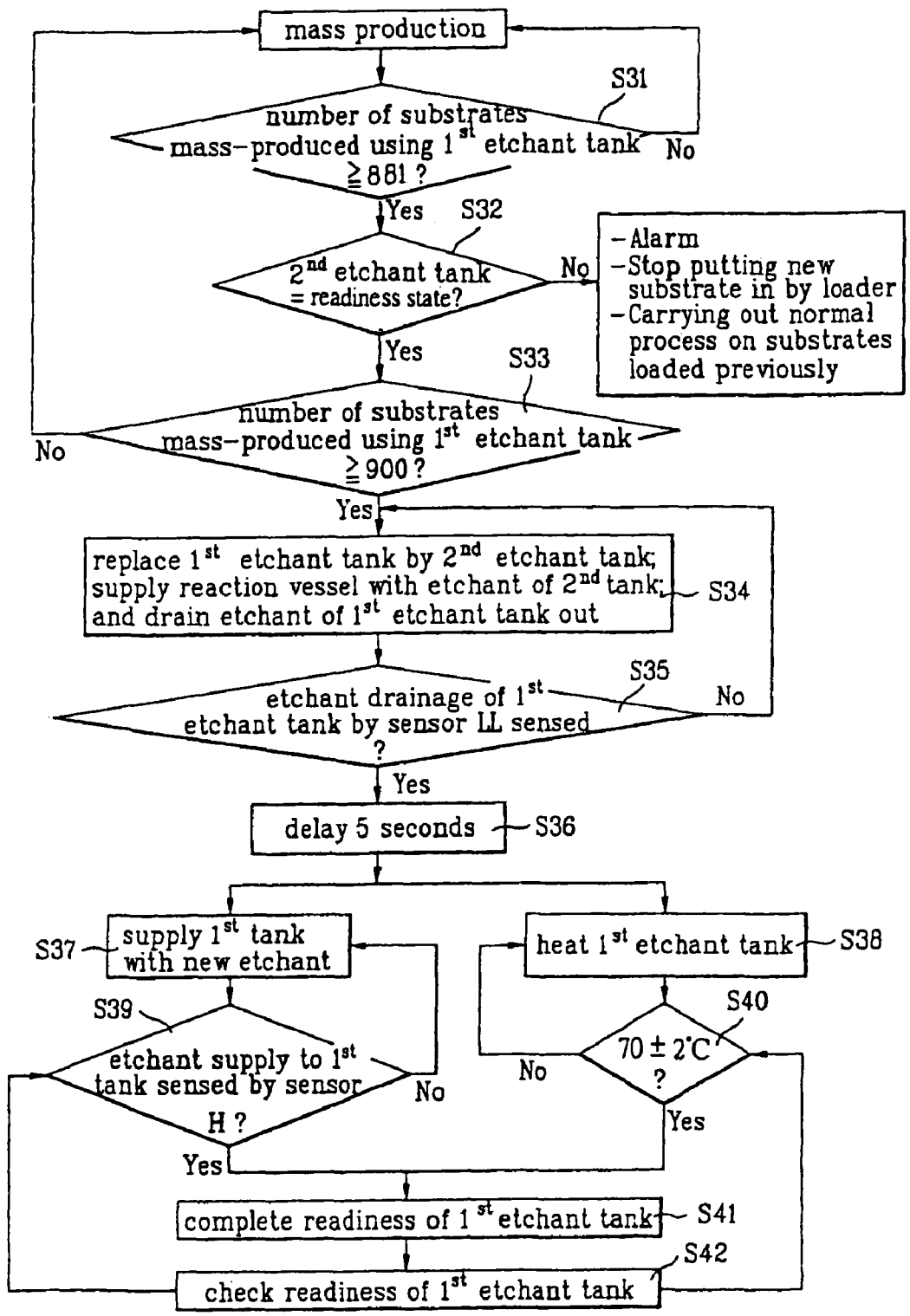
FIG. 4 illustrates a flowchart of a process of etching or stripping a substrate of a liquid crystal display device in an apparatus according to the present invention.

A method of etching or stripping substrates for a liquid crystal display device using the apparatus according to the present invention is explained by referring to FIG. 4 as follows.

First, in an apparatus having first and second etchant tanks 410 and 402 for fabricating a liquid crystal display device, it is assumed that nine hundred bonded substrates can be etched using an etchant in the first etchant tank 401 and the number of the substrates that can be placed in the apparatus is nineteen. Meanwhile, a controller 316 counts the number of the etched substrates through a counter (not shown in the drawing) or the like whenever each of the substrates is etched in the etching reaction vessel 303.

If the number of the counted substrates reaches a maximum substrates number (nine hundred in the present embodiment) available for the capacity of the first etchant tank 401–(minus) the number corresponding to the current number (nineteen in the present embodiment) of the substrates loaded on (which are placed in) the etching apparatus, i.e., 881, which is 900 minus 19, the controller 316 checks whether the second etchant tank 402, by which the first etchant tank 401 will be replaced, is in readiness for use or not.

If the second etchant tank 402 for replacement fails to be in readiness, the controller 316 controls the loader 300 to make the substrate following not be placed in the etching apparatus.

Meanwhile, the controller 316 normally carries out all the processes explained in FIG. 3 on the nineteen substrates loaded previously on the etching apparatus, and then unloads the nineteen substrates from the etching apparatus in order. The controller 316 then generates an alarm informing that the next etchant tank to be put in operation is not in readiness.

An etching or stripping method according to the present invention is explained in detail by referring to FIG. 4 as follows. The flowchart in FIG. 4 illustrates a system program stored in the controller 316 in FIG. 3.

First of all, the counter counts how many substrates are etched by the etchant of the first etchant tank 401 in the process of etching the substrates using the etchant of the first etchant tank 401. Namely, the substrate having the Cr layer and the photoresist depicted on the Cr layer is etched in accordance with the pattern of the photoresist in the three etching, zones constituting the etching reaction vessel 303.

The controller 316 checks whether the number of the substrates etched by the etchant of the first etchant tank 401 is equal to or greater than 881 (S31). If the counted number is smaller than 881, the controller 316 keeps carrying out the etching process normally. Meanwhile, if the counted number is equal to or greater than 881, it is checked whether the second etchant tank 402 is in readiness so as to be put in service (S32).

In this case, 'readiness' means a state in which the second etchant tank 402 can discharge a required amount of the etchant therein to the three etching zones in the etching reaction vessel 303 within a required time and maintain the etchant therein at a temperature within a setup range.

If the second etchant tank 402 is not in readiness, the controller 316 generates an alarm informing of such a state and controls the loader 300 to have substrate following not be put in the etching apparatus. Meanwhile, the nineteen substrates having been put in the etching apparatus are transferred and processed by the components in FIG. 3. Namely, the substrates put in previously are etched normally in accordance with the required patterns. If the second etchant tank 402 is in readiness, the controller 316 checks whether the nine hundred substrates amounting to the maximum production capacity are etched through the etchant of the first etchant tank 401 or not (S33).

If the number of the substrates etched by the etchant of the first etchant tank 401 fails to reach the 'nine hundred' as the maximum production capacity, the controller 316 normally carries out the process of etching the substrate using the etchant of the first etchant tank 401. If the number of the substrates etched by the etchant of the first etchant tank 401 reaches the 'nine hundred' as the maximum production capacity, the first etchant tank 401 is replaced by the second etchant tank 402 (S34). Namely, the etchant of the second etchant tank 402 is supplied to the etching reaction vessel 303, and the etchant in the first etchant tank 401 is drained to the outside.

Subsequently, the controller 316 senses whether the etchant in the first etchant tank 401 is entirely drained using a least height sensor (LL) of the first sensor unit 403 (S35). In this case, the least height sensor (LL) is a sensor checking whether the etchant in the first etchant tank 401 is entirely drained or not.

If the etchant remains at a level higher than the least height sensor (LL), the controller 316 keeps draining the etchant of the first etchant tank 401 (S34). If it is sensed that the etchant is entirely drained, the controller 316 has a delay time of five seconds (S36).

After the delay time of five seconds goes by, the controller 316 supplies the first etchant tank 401 with new etchant and simultaneously heats the first etchant tank 401 so that an inner temperature of the first etchant tank 401 stays within a predetermined temperature range (70° C.±2° C. in the embodiment of the present invention).

Meanwhile, the controller 316 senses by a most height sensor (H) of the first sensor unit 404 whether the first etchant tank 401 is filled with the new etchant to the required amount while the new etchant is supplied to the first etchant tank 401 (S39).

If the first etchant tank 401 is not filled with the new etchant to the required amount, the controller 316 keeps supplying the first etchant tank 401 with the new etchant (S37). Meanwhile, the controller 316 checks whether the inner temperature of the first etchant tank 401 which is being heated stays within 70° C.±2° C. through a temperature sensor (not shown in the drawing) (S40). If the inner temperature fails to stay within 70° C.±2° C., the first etchant tank 401 is heated (S38) more.

Meanwhile, if the first etchant tank 401 is filled with the new etchant to the extent of the required amount and the inner temperature stays within 70° C.±2° C., the first etchant tank 401 is in readiness (S41). Namely, 'readiness' means a state in which the first etchant tank 401 enables the discharge of a required amount of the etchant therein to the three etching zones in the etching reaction vessel 303 within a required time and maintain the etchant therein at a temperature within a setup range of 70° C.±2° C.

Subsequently, the controller 316 checks whether the first etchant tank 401 is in readiness through the sensors (S42).

In the embodiment of the present invention, the maximum number of the substrates etched by the etchant of a single tank is set up as nine hundred and the other number of the substrates to be placed in the etching apparatus is set up as nineteen. Hence, the number of the substrates corresponding to a time point that the currently used tank is replaced by another tank is 881. The numbers of the substrates defined by the embodiment of the present invention can be modified in accordance with various conditions.

Accordingly, the apparatus for etching substrates in a liquid crystal fabrication apparatus and method thereof according to the present invention have the following effects or advantages.

First of all, the readiness of the new etchant tank is checked before the currently used tank is replaced by a new etchant tank, and normal processes are carried out on the previously placed substrates while readiness is checked. Therefore, the present invention enables mass production of the substrates to proceed, even during etchant exchange.

Secondly, the readiness of the new etchant tank is checked before the currently used etchant tank is replaced by a new etchant tank. Therefore, the present invention enables the reduction of a failure rate of the mass-produced substrates which may occur when the tank failing to be in readiness is used.

Thirdly, the readiness of the etchant tank to be used is checked before the used tank is replaced. Therefore, the present invention prevents downtime of the etching or stripping apparatus due to the use of the unready etchant tank, thereby enabling an increase in yield of mass-produced substrates.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. An etching and stripping method of an etching and stripping apparatus, comprising:
    (a) transferring substrates, loaded from a loader, to an etching reaction vessel through a first neutral unit, the substrates having a deposited layer and a photoresist pattern thereon;
    (b) etching the deposited layer, exposed through the photoresist pattern, on the substrates in the etching reaction vessel;
    (c) cleaning the substrates after completion of the etching process, in a first cleaning unit;
    (d) removing etchant on the cleaned substrates with an air-knife;
    (e) transferring the substrates away from the air-knife to a stripping reaction vessel through a first transferring unit and a second neutral unit;
    (f) stripping the photoresist pattern on the substrates in the stripping reaction vessel;
    (g) cleaning the substrates, after completing the stripping process, using an organic solvent in a processing unit;
    (h) cleaning the substrates obtained from the processing unit in a second cleaning unit;
    (i) cleaning the substrates obtained from the second cleaning unit in a cavitation jet unit;
    (j) cleaning the substrates obtained from the cavitation jet unit by a shower unit;
    (k) drying the substrates obtained from the shower unit in a dry unit;
    (l) transferring the substrates obtained from the dry unit to an unloading unit through a second transferring unit;
    wherein the method comprises:
    etching or stripping the substrates in the appropriate reaction vessel by using an etchant from a first etchant tank;
    counting a number of the substrates etched or stripped using the etchant from the first etchant tank;
    checking readiness of a second etchant tank when the counted number of the substrates processed using the etchant from the first etchant tank reaches a predetermined number, wherein the predetermined number is determined by subtracting a number of substrates which are currently placed in the etching and stripping apparatus from a maximum substrate number for processing by the steps (a) through (l);
    stopping loading the substrates from the loader into the etching and stripping apparatus when the second etchant tank fails to be in readiness and the counted number exceeds the predetermined number;
    continuing etching or stripping process on the substrates in the appropriate reaction vessel using the etchant from the first etchant tank when the second etchant tank fails to be in readiness and the counted number is between the predetermined number and the maximum substrate number;
    finishing the etching or stripping process on the substrates currently placed in the etching and stripping apparatus and then unloading the finished substrates from the etching and stripping apparatus in order; and
    generating an alarm informing that the second tank fails to be in readiness after unloading the finished substrates,
    wherein the step of checking readiness of the second etchant tank is not performed until the counted number of the substrate processed using the etchant from the first etchant tank reaches the predetermined number lower than the maximum substrate number,
    wherein if the second tank fails to be in readiness when the counted number reaches the predetermined number, the steps of stopping loading the substrates, continuing and finishing processing of the substrates currently placed in the etching and stripping apparatus by applying any of the steps (a) to (l) that remain, unloading the finished substrates, and generating the alarm in order.

2. The method of claim 1, further comprising placing the first etchant tank be in a state of readiness after the second etchant tank supplies the etchant for carrying out the etching or stripping process.

3. The method of claim 2, wherein placing the first etchant tank in readiness includes:

discharging the etchant in the first etchant tank completely;

waiting for a predetermined delay time;

supplying the first etchant tank with a new etchant amounting to a required quantity;

heating the first etchant tank so that a temperature of the new etchant filling the first etchant tank stays within a setup temperature range; and checking whether the first etchant tank is in readiness or not.

4. The method of claim 1, wherein the readiness of the second etchant tank enables the draining of a required quantity of the etchant to the reaction vessel within a required time and maintaining a temperature of the etchant filling the second etchant tank at a temperature within a setup temperature range.

5. The method of claim 1, wherein the maximum substrate number is 900, the number of substrates which are currently placed in the etching and stripping apparatus is 19, and the predetermined number is 881.

6. The method of claim 3, wherein discharging the etchant of the first etchant tank includes checking whether the etchant of the first etchant tank is drained or not by using a sensor.

7. The method of claim 3, wherein supplying the first etchant tank with the new etchant amounting to a required quantity includes checking how much the first etchant tank is filled with the new etchant by using a sensor.

8. The method of claim 3, wherein the predetermined temperature range is 70±2° C.

9. The method of claim 1, further comprising:

draining the etchant in the first etchant when the counted number of the substrates processed using the etchant from the first etchant tank reaches the maximum substrate number; and generating an alarm when the counted number reaches the maximum substrate number and the second etchant tank fails to be in readiness.

10. The method of claim 1, further comprising carrying out the etching or stripping process on the substrates in the appropriate reaction vessel by using the etchant from the second etchant tank when the second etchant tank is in readiness for use and the counted number of the substrates processed using the etchant from the first etchant tank reaches the maximum substrate number.

11. The method of claim 10, further comprising placing the first etchant tank in readiness for later use after the second etchant tank supplies the etchant for carrying out the etching or stripping process.

12. The method of claim 11, wherein placing the first etchant tank in readiness includes:

discharging the etchant in the first tank completely;

waiting for a predetermined delay time;

supplying the first etchant tank with a new etchant and simultaneously heating the first etchant tank so that a temperature of the new etchant in the first etchant tank stays within a predetermined temperature range; and checking whether the first etchant tank is in readiness or not.

13. The method of claim 1, wherein when the second etchant tank is in readiness for use, a temperature of the etchant in the second etchant tank stays within a predetermined temperature range and a required quantity of the etchant in the second etchant tank is drainable to the appropriate reaction vessel within a required time.

* * * * *